United States Patent
Maeno

(10) Patent No.: US 7,829,247 B2
(45) Date of Patent: Nov. 9, 2010

(54) PHOTOMASK AND METHOD FOR FORMING WIRING PATTERN USING THE SAME

(75) Inventor: Yoshinori Maeno, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 578 days.

(21) Appl. No.: 11/892,082

(22) Filed: Aug. 20, 2007

(65) Prior Publication Data
US 2008/0076041 A1 Mar. 27, 2008

(30) Foreign Application Priority Data
Sep. 26, 2006 (JP) .............................. 2006-268897

(51) Int. Cl.
*G03F 1/00* (2006.01)
*G03C 5/00* (2006.01)
(52) U.S. Cl. ............................ 430/5; 430/311; 430/394
(58) Field of Classification Search ..................... 430/5, 430/311, 394
See application file for complete search history.

(56) References Cited
U.S. PATENT DOCUMENTS
2005/0130045 A1* 6/2005 Ozawa ......................... 430/5

FOREIGN PATENT DOCUMENTS
JP  3117886  6/1996
JP  2002-124568  4/2002

* cited by examiner

*Primary Examiner*—Stephen Rosasco
*Assistant Examiner*—Rashid Alam
(74) *Attorney, Agent, or Firm*—Rabin & Berdo, PC

(57) ABSTRACT

A photomask includes a transparent mask substrate, and a plurality of square mask cells provided on the mask substrate. Each mask cell includes at least one of a light transmitting region and a light shielding region. A planar region (in which the mask cells are formed) of the mask substrate includes a first region, a second region surrounding the first region, and a third region outside the second region. The first region includes a first group of mask cells transmitting lights of a first light intensity greater than zero and less than or equal to 1. The second region includes a second group of mask cells transmitting lights of a second light intensity greater than zero and less than the first light intensity. The third region includes a third group of mask cells transmitting lights of a third light intensity greater than or equal to zero and less than the second light intensity.

10 Claims, 7 Drawing Sheets

PHOTOMASK AND METHOD FOR FORMING WIRING PATTERN USING THE SAME

BACKGROUND OF THE INVENTION

This invention relates to a method for forming a wiring pattern of a semiconductor device of a dual damascene structure.

As the density of a semiconductor integrated circuit increases, a manufacturing technique of a semiconductor device having a multilayer structure has been rapidly developed. In order to manufacture the semiconductor device having the multilayer structure, it is necessary to form a trench wiring for connecting respective elements arranged along a horizontal direction and a via-hole wiring for connecting respective elements arranged along a vertical direction. Recently, a semiconductor element having a dual damascene structure has been widely used, in which the trench wiring and the via-hole wiring are formed at the same time. In the manufacturing of the dual damascene structure, a pattern of a hard mask (such as $SiO_2$ layer) is formed, and an insulation film (such as Low-k layer) having low dielectric constant is etched via the hard mask to thereby form a trench and a via-hole. Then, wirings are formed in the trench and the via-hole using a material (such as Cu) that has high vapor pressure and does not easily form compound.

In the above described prior art, in a step in which a hard mask is exposed, a corner (i.e., a shoulder) of the hard mask tends be grounded and tapered, i.e., a faceting (i.e., a shoulder sag) tends to occur. In order to prevent the faceting of the hard mask, there is proposed anther method for forming the dual damascene structure. In this method, a trench-formation resist is coated on the hard mask, and the hard mask is patterned by means of photolithography using the trench-formation resist and is etched. Then, a via-formation resist is coated on the hard mask, and the hard mask is patterned by means of photolithography using the via-formation resist and is etched (see, for example, Patent Document No. 1). Further, there is proposed another method for forming a dual damascene structure using a photomask having a gray scale (see, for example, Patent Document No. 2).

Patent Document No. 1: Japanese Laid-open Patent Publication No. 2002-124568.

Patent Document No. 2: Japanese Patent Publication No. 3117886.

However, a method disclosed in the Patent Document No. 1 includes two photolithographic steps and two etching steps. Therefore, the manufacturing process may become complicated, and the patterning accuracy may be reduced.

Further, in a method disclosed in the Patent Document No. 2, a minimum pitch, minimum dimension and minimum step size of a mask pattern are limited by the resolution and the dimension controllability in the manufacturing process of the photomask, and are subject to applicable lower limits. Furthermore, in the case where a highly accurate manufacturing process of the photomask is employed, there is a problem that the manufacturing cost of the photomask increases, and therefore a practical dual damascene structure can not be obtained.

SUMMARY OF THE INVENTION

As a result of a dedicated research, the inventor has found that the above described problems can be solved by using a resist pattern having different thicknesses to thereby form grooves of different depths or slope portions on a common substrate, so as to obtain a practical dual damascene structure. That is, the inventor has found that the above described problems can be solved by using a photomask with which latent images of grooves of different depths and a slope portion whose depth gradually changes can be projected onto a resist layer.

The present invention is intended to solve the above described problems, and an object of the present invention is to accomplish a high resolution gray scale mask, to manufacture a photomask having high accuracy and high resolution with low cost, and to apply the photomask to the manufacturing of the dual damascene structure.

To be more specific, an object of the present invention is to enable the formation of the dual damascene structure (corresponding to a designed pattern) using high resolution gray scale mask by means of one exposing step, one developing step and one etching step, to thereby shorten the manufacturing process of the dual damascene structure and enhance the pattern accuracy.

The present invention provides a photomask used for exposure to form a resist pattern having nonuniform thickness. The photomask includes a transparent mask substrate, and a plurality of square mask cells provided on a planar region of the mask substrate. Each of the mask cells has a side shorter than a resolution limit of an optical system of an exposing device in which the photomask is used. The mask cell includes at least one of a light transmitting region and a light shielding region formed of a light shielding film provided on the mask substrate. The light intensity of the transmitted light of the mask cell is a standardized light intensity, and the light intensity of transmitted light is determined based on a ratio of an area of the light transmitting region to an area of the mask cell. The planar region includes a first region, a second region surrounding the first region, and a third region outside the second region. The first region includes a first group of mask cells transmitting lights of a first light intensity greater than zero and less than or equal to 1. The second region includes a second group of mask cells transmitting lights of a second light intensity greater than zero and less than the first light intensity. The third region includes a third group of mask cells transmitting lights of a third light intensity greater than or equal to zero and less than the second light intensity.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Hereinafter, embodiments of the present invention will be described with reference to attached drawings. In the attached drawings, shapes, sizes and positions of the respective components are illustrated schematically so as to facilitate understanding of the present invention. Numerical examples and other conditions described below are merely examples, and the present invention is not limited to the preferred embodiments. In the attached drawings, a hatching for representing cross section is partially omitted, in order to avoid complexity.

First Embodiment

Photomask

Figure 1A:
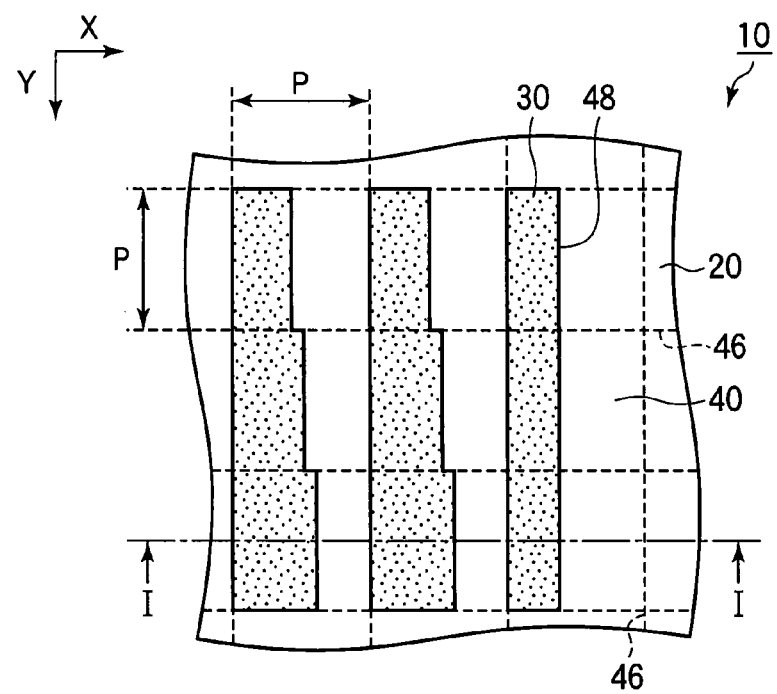
FIGS. 1A and 1B are a plan view and a sectional view showing a photomask according to a first embodiment of the present invention.
Figure 1B:
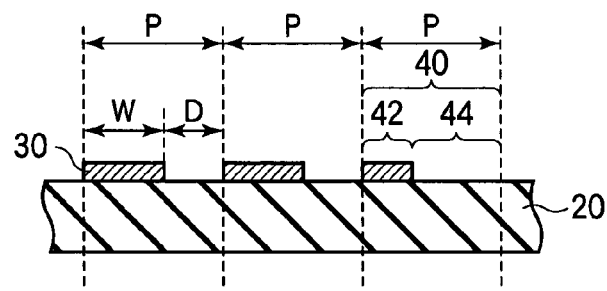
Figure 1C:
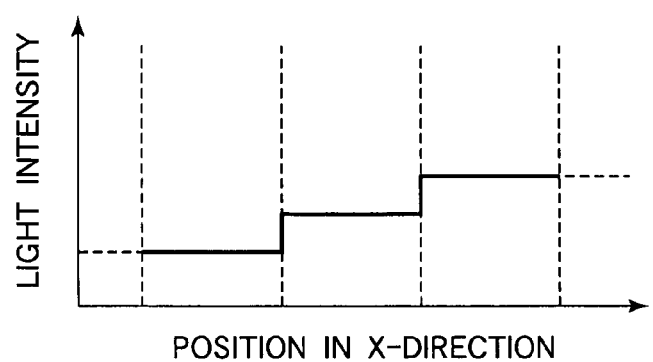
FIG. 1C is a graph showing a distribution of light intensity of transmitted light of the photomask shown in FIGS. 1A and 1B.

A photomask according to the present invention for forming a resist pattern will be described with reference to FIGS. 1A, 1B and 1C. FIGS. 1A through 1C schematically illustrate the photomask. FIG. 1A is a plan view of a photomask. FIG. 1B is a sectional view taken along line I-I shown in FIG. 1A. FIG. 1C is a graph showing a relationship between the position along the line I-I (i.e., X direction) and the light intensity of transmitted light. In FIG. 1C, a horizontal axis indicates the position in the X direction, and a vertical axis indicates the light intensity of the transmitted light.

A photomask 10 includes a transparent mask substrate 20 formed of a silica glass or the like, and a plurality of mask cells 40 formed on the mask substrate 20. The mask cells 40 are square-shaped, and have the same sizes. The mask cells 40 are disposed on a plurality of unit mask cell regions provided on a main surface of the mask substrate 20. The unit mask cell regions are divided by a plurality of imaginary grid lines 46 formed in X-direction (i.e., a row direction) and in Y direction (i.e., a column direction) on the main surface of the mask substrate 20 at predetermined intervals. Therefore, the unit mask cell regions are arranged in an orthogonal matrix.

The mask cell 40 includes at least one of a light transmitting region 44 and a light shielding region 42. On the light shielding region 42 of the mask substrate 20, a light shielding film 30 is formed by, for example, vapor deposition of chrome. The mask cell 40 is a basic unit that controls the light intensity of the light that passes through the photomask 10. Since the mask cell 40 have the same area, the light intensity of the light passing through the mask cell 40 is determined by the ratio (i.e., area ratio) of the area of the light transmitting region 44 with respect to the total area of the mask cell 40. In other words, as the area of the light transmitting region 44 becomes large with respect to the total area of the mask cell 40, the light intensity of the light passing through the mask cell 40 increases (FIG. 1C).

The light intensity of the transmitted light of the mask cell 40 can be a defined by a standardized light intensity. The standardized light intensity is determined as follows: when the light intensity of the light passing through any of the mask cells 40 is the maximum, the light intensity of the light passing through other mask cell 40 is expressed as a relative intensity to the maximum light intensity (expressed as 1). Therefore, the standardized light intensity takes a value from 0 to 1 (including 0 and 1). The respective mask cells 40 are assigned the standardized light intensity determined by design.

In an example shown in FIG. 1A, each mask cell 40 (in which both of the light transmitting region 44 and the light shielding region 42 are provided) is divided by an imaginary halving line 48 extending in the Y-direction into two. The light transmitting region 44 is set on one side (a right side in FIG. 1A) with respect to the imaginary halving line 48, and the light shielding region 42 is set on the other side (a left side in FIG. 1A) with respect to the imaginary halving line 48. It is preferable that the light transmitting regions 44 of the respective mask cells 40 are set on the same sides with respect to the imaginary halving line 48 for the following reason.

If the target shape of the resist pattern is a curved shape where the thickness continuously changes, the mask cells 40 transmitting the lights of the same light intensity may be continuously formed corresponding to a region of the resist pattern where the thickness slightly changes. With the configuration in which the light transmitting regions 44 are set on the same side with respect to the imaginary halving line 48, the light shielding regions 42 can be formed as an integrated rectangle, where the mask cells 40 transmitting the lights of the same light intensity are continuously formed in the Y-direction. The amount of data required for forming the mask patterns increases or decreases according to the number of rectangles constituting the mask patterns, and therefore the amount of data for forming the mask patterns can be reduced when the light shielding films 30 of the mask cells 40 are formed as an integrated rectangle. As a result, the cost can be reduced.

In an example shown in FIGS. 1A and 1B, the light transmitting region 44 and the light shielding region 42 are set in every mask cell 40. However, the configuration of the photomask 10 is not limited to this example. The photomask 10 can have a mask cell including light transmitting region 44 only (i.e., including no light shielding region 42) or a mask cell including light shielding region 42 only (i.e., including no light transmitting region 44). The width of the light transmitting region 44 (i.e., a space) is expressed as a space width D, and the width of the light shielding region 42 (i.e., a line) is expressed as a width W.

The length P of each side of the mask cell 40 (also referred to as a mask pitch P) is set shorter than a length of a resolution limit of an optical system of an exposing device in which the photomask 10 is used. Therefore, when the resist film is exposed using the photomask 10, a contrast with which the mask pattern of the photomask 10 is resolved is not obtained. Therefore, after the resist film is exposed via the photomask 10 and developed, the resist film is not separated, but the thickness of the resist film continuously changes.

Therefore, using the above described photomask 10 for forming the resist pattern, the light intensities of the lights passing through the respective mask cells 40 can be controlled individually.

Figure 2A:
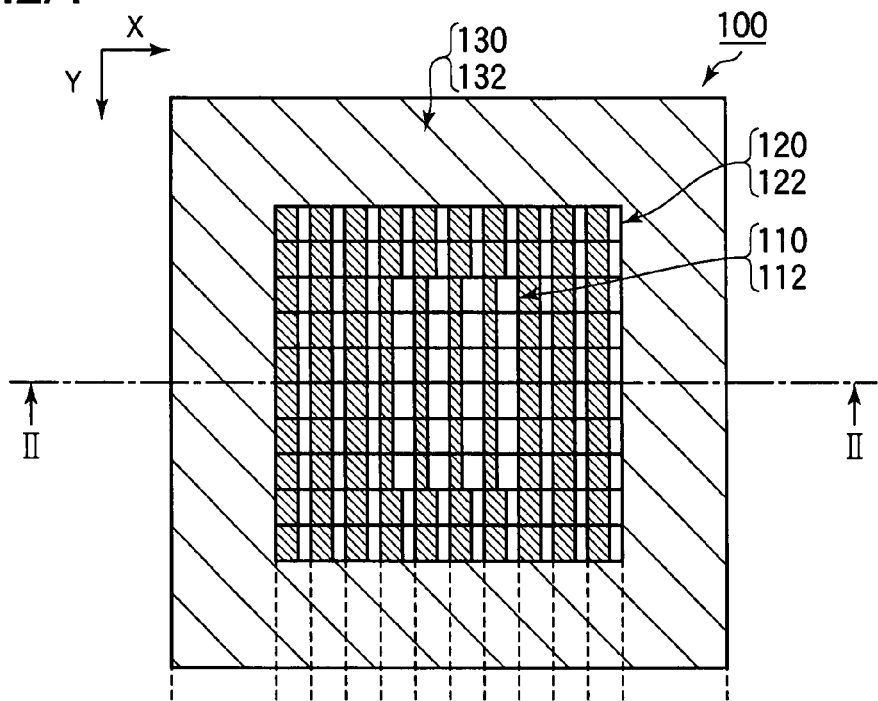
FIGS. 2A and 2B are a plan view and a sectional view showing a first photomask according to the first embodiment of the present invention.
Figure 2B:
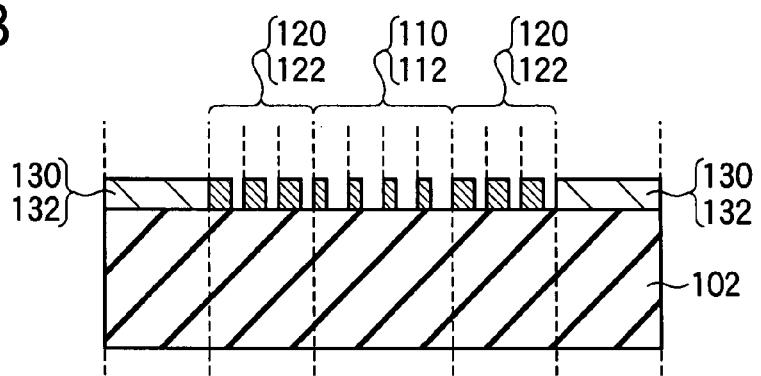
Figure 2C:
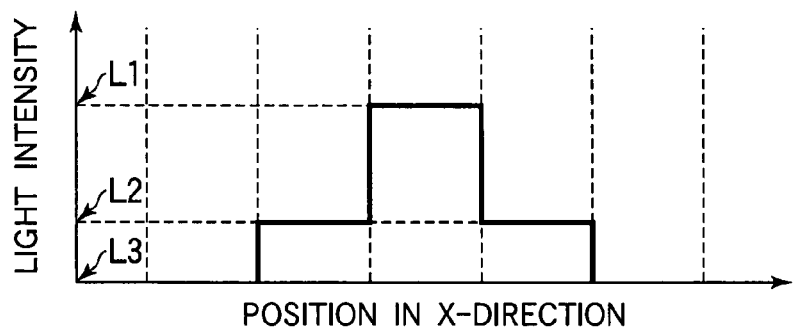
FIG. 2C is a graph showing a distribution of light intensity of transmitted light of the first photomask shown in FIGS. 2A and 2B.

Next, a first photomask 100 according to the first embodiment will be described with reference to FIGS. 2A, 2B and 2C. FIGS. 2A through 2C schematically illustrate the first photomask 100. FIG. 2A is a plan view of the first photomask 100. FIG. 2B is a sectional view taken along line II-II shown in FIG. 2A. FIG. 2C is a graph showing a relationship between the position along the line II-II (i.e., X direction) and the light intensity of transmitted light. In FIG. 2C, a horizontal axis indicates the position in the X direction, and a vertical axis indicates the light intensity of the transmitted light.

The first photomask 100 includes a transparent mask substrate 102 formed of silica glass or the like. On the surface (i.e., a planar region) of the mask substrate 102, a first region 110, a second region 120 surrounding the first region 110, and a third region 130 outside of the second region 120 are provided. In an example, the mask cells of the first region 110 are arranged in 4 rows and 6 columns, and the mask cells of the second region 120 are arranged in 10 rows and 10 columns. However, the configuration of the first photomask 100 is not limited to this example.

A first mask cell group 112 is composed of mask cells in the first region 110 that transmit the lights of the same light intensity (referred to as a first light intensity). The standardized light intensity of the first light intensity (L1) is greater than 0, and is less than or equal to 1 (i.e., $0 < L1 \leq 1$).

A second mask cell group 122 is composed of mask cells in the second region 120 surrounding the first region 110 that transmit the lights of the same light intensity (referred to as a second light intensity) different from the first light intensity. The standardized light intensity of the second light intensity (L2) is greater than 0, and is less than the first light intensity (i.e., $0 < L2 < L1 \leq 1$).

A third mask cell group 132 is composed of mask cells in the third region 130 disposed outside the second region 120 that transmit the lights of the same light intensity (referred to as a third light intensity) different from the first and second light intensities. The standardized light intensity of the third light intensity (L3) is greater than or equal to 0, and is less than the second light intensity (i.e., $0 \leq L3 < L2$). In this embodiment, the third light intensity is set to zero. In other words, the third region 130 is a light shielding region.

FIG. 2C illustrates the distribution of the light intensities of the transmitted lights of the first region 110, the second region 120 and the third region 130 of the first photomask 100. The light intensity of the transmitted light of the first region 110 is the first light intensity which is a constant value. The light intensity of the transmitted light of the second region 120 is the second light intensity which is a constant value and is less than the first light intensity. The light intensity of the transmitted light of the third region 130 (outside the first and second regions 110 and 120) is the third light intensity which is zero, i.e., a constant value.

Therefore, by projecting the photomask pattern onto a resist layer using the first photomask 100 and then developing the resist layer, it is possible to obtain a resist pattern divided into the first region 110 and the second region 120. That is, it is possible to obtain a resist pattern having a groove shape with a plurality of steps (two steps in this example) having different thicknesses (i.e., different depths) according to the light intensities of the transmitted lights of the first region 110 and the second region 120 where the step of the first region 110 is deeper than the step of the second region 120.

Figure 3A:
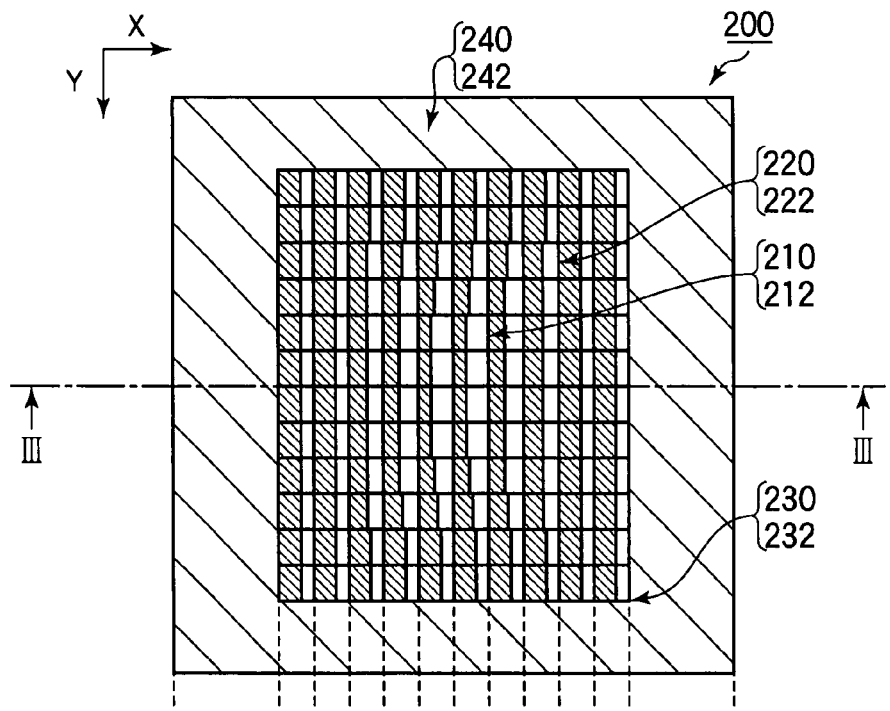
FIGS. 3A and 3B are a plan view and a sectional view showing a second photomask according to the first embodiment of the present invention.
Figure 3B:
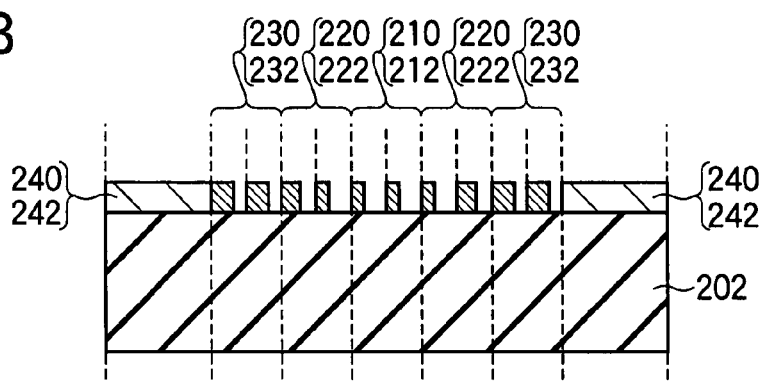
Figure 3C:
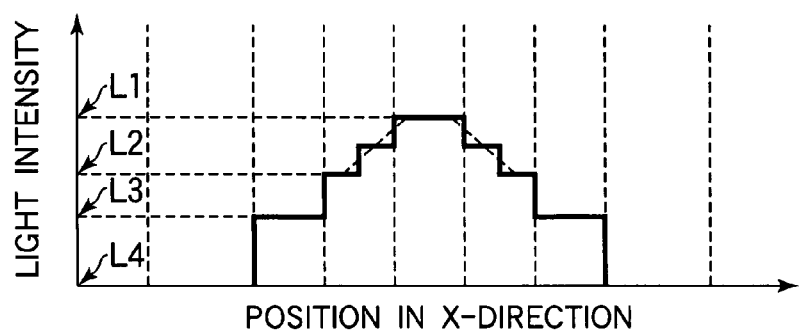
FIG. 3C is a graph showing a distribution of light intensity of transmitted light of the second photomask shown in FIGS. 3A and 3B.

Next, a second photomask 200 according to the first embodiment will be described with reference to FIGS. 3A, 3B and 3C. FIGS. 3A through 3C schematically illustrate the second photomask 200. FIG. 3A is a plan view of the second photomask 200. FIG. 3B is a sectional view taken along line III-III shown in FIG. 3A. FIG. 3C is a graph showing a relationship between the position along the line III-III (i.e., X direction) and the light intensity of the transmitted light. In FIG. 3C, a horizontal axis indicates the position in the X direction, and a vertical axis indicates the light intensity of the transmitted light.

The second photomask 200 includes a transparent mask substrate 202 formed of silica glass or the like. On the surface (i.e., a planar region) of the mask substrate 202, a first region 210, a second region 220 surrounding the first region 210, a third region 230 surrounding of the second region 220, and a fourth region 240 outside the third region 230 are provided. In an example, the mask cells of the first region 210 are arranged in 2 rows and 4 columns, and the mask cells of the second region 220 are arranged in 6 rows and 8 columns. The mask cells of the third region 220 are arranged in 10 rows and 12 columns. However, the configuration of the second photomask 200 is not limited to this example.

A first mask cell group 212 is composed of mask cells in the first region 210 that transmit the lights of the same light intensity (referred to as a first light intensity). The standardized light intensity of the first light intensity (L1) is greater than 0, and is less than or equal to 1 (i.e., $0 < L1 \leq 1$).

A second mask cell group 222 is composed of mask cells in the second region 220 (surrounding the first region 210) that respectively transmit the lights of linearly changing light intensities. To be more specific, the mask cells at the boundary with the first region 210 transmit the lights of the first light intensity, and the mask cells at the boundary with the third region 230 transmit the lights of the second intensity. Between these boundaries, mask cells transmit the lights of the light intensities changing (in this example, decreasing) linearly from the boundary with the first region 210 to the boundary with the third region 230. The standardized light intensity of the second light intensity (L2) is greater than 0, and is less than the first light intensity (i.e., $0 < L2 < L1 \leq 1$).

A third mask cell group 232 is composed of mask cells in the third region 230 surrounding the second region 220 that transmit the lights of the same light intensity (referred to as a third light intensity) different from the first and second light intensities. The standardized light intensity of the third light intensity (L3) is greater than 0, and is less than the second light intensity (i.e., $0 < L3 < L2$).

A fourth mask cell group 242 is composed of mask cells in the fourth region 240 disposed outside the third region 230 that transmit the lights of the same light intensity (referred to as a fourth light intensity) different from the first, second and third light intensities. The standardized light intensity of the fourth light intensity (L4) is greater than or equal to 0, and is less than the third light intensity (i.e., $0 \leq L4 < L3$). In this embodiment, the fourth light intensity is set to zero. In other words, the fourth region 240 is a light shielding region.

FIG. 3C illustrates the distribution of the light intensities of the transmitted lights of the first region 210, the second region 220, the third region 230 and the fourth region 240 of the second photomask 200. The light intensity of the transmitted light of the first region 210 is the first light intensity which is a constant value. The light intensity of the transmitted light of the second region 220 linearly changes from the first light intensity at the boundary with the first region 210 to the second light intensity at the boundary with the third region 230. The light intensity of the transmitted light of the third region 230 is the third light intensity which is a constant value. The light intensity of the transmitted light of the fourth region 240 is a fourth light intensity which is zero, i.e., a constant value.

Therefore, by projecting the photomask pattern onto a resist layer using the second photomask 200, and by developing the resist layer, it is possible to obtain a resist pattern divided into regions corresponding to the first region 210, the second region 220 and the third region 230. That is, it is possible to obtain a resist pattern having a vertical step portion and a slope portion of different thicknesses.

Second Embodiment

Method for Forming Dual Damascene Structure Using First Photomask

A method for forming a dual damascene structure using the above described first photomask 100 will be described.

First, a method for forming a resist pattern using the first photomask 100 on a substrate will be described. The description will be made to an example using a silicon substrate.

The silicon substrate has a diameter of 6 inches. A positive-type resist, for example, "IX-410" (product name) manufactured by JSR Corporation, is coated on the silicon substrate using a spin coater. The thickness of the resist coated on the silicon substrate is 3.5 μm. An i-ray (wavelength λ=365 nm) stepper, for example, "NSR-2205i11D" (product name) manufactured by Nikon Corporation, is used as an exposing device. The exposure conditions are as follows: the numerical aperture of projection lens NA=0.5, the coherence factor σ=0.5, and the magnification of a reduction projection is 5. Further, the length of each side of the mask cell 40 shown in FIG. 1B (i.e., a mask pitch P) is 400 nm.

Figure 4:
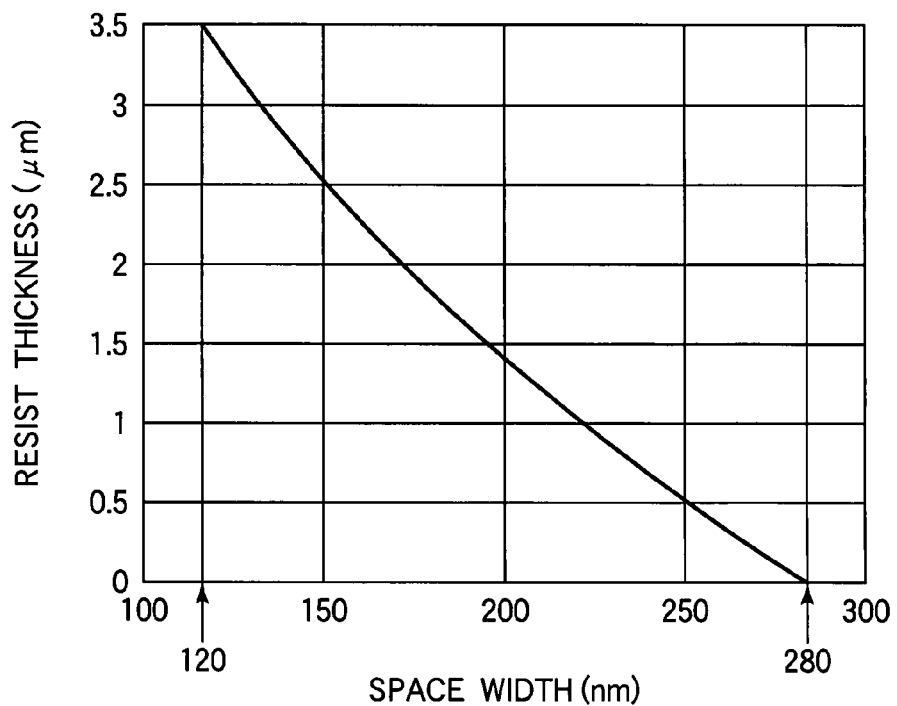
FIG. 4 is a graph showing a relationship between the space width of mask cells and the resist film thickness, according to the second embodiment of the present invention.

A process for positioning the mask pattern of the first photomask 100 will be described with reference to FIG. 4. In order to determine the position of the mask pattern, it is necessary to identify the relationship between the space width of the mask cell and the thickness of the resist film that remains unremoved (hereinafter, referred to as a resist film thickness). FIG. 4 shows the relationship between the space width D (see FIG. 1B) and the thickness of the resist film that remains unremoved after the exposure and development on condition that the exposure time is 280 msec. In FIG. 4, a horizontal axis indicates the space width (nm) of the mask cell, and a vertical axis indicates the resist film thickness (μm).

According to the characteristic curve shown in FIG. 4, the resist film thickness of 3.5 μm can be obtained when the space width is 120 nm (i.e., the minimum space width) on condition that the exposure time is 280 msec. Further, the resist film thickness of 0 μm can be obtained when the space width is 280 nm (i.e., the maximum space width) on the same exposure condition. Therefore, by controlling the space width, for example, by 5 nm, the target resist film thickness can be adjusted in 32 steps in the range from 0 to 3.5 μm.

In this case, the photomask is the same as the photomask 100 having been described in the first embodiment. Further, the standardized light intensities of the first, second and third light intensities L1, L2 and L3 satisfy:

$$0=L3<L2<L1=1.$$

Figure 5A:
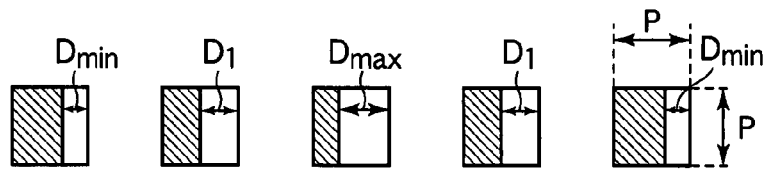
FIGS. 5A and 5B illustrate the relationship between configurations of the mask cells of the first photomask and shapes of the respective parts of the resist pattern according to the second embodiment of the present invention.
Figure 5B:
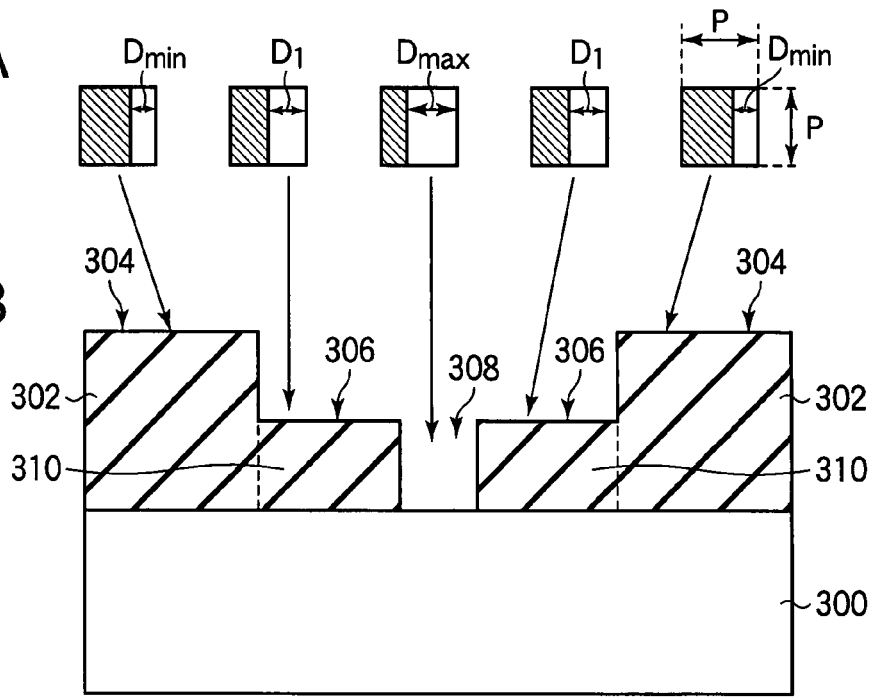

FIG. 5A illustrates configurations of the mask cells corresponding to shapes of respective parts of the resist pattern, and FIG. 5B illustrates the shape of the resist pattern after the exposure via the mask cells and development.

As shown in FIGS. 5A and 5B, in a region 304 corresponding to mask cells each having the minimum space width $D_{min}$ (i.e., 120 nm), the residual ratio of the resist (after the exposure and development) is 100%. In other words, the resist layer is not removed in the region 304, and forms a resist layer 302 completely remaining on the silicon substrate 300. The region 304 corresponds to the third region 130 (i.e., a light shielding region) of the first photomask 100.

In a region 308 corresponding to mask cells each having the maximum space width $D_{max}$ (i.e., 280 nm), the residual ratio of the resist (after the exposure and development) is 0%. In other words, the resist layer of the region 308 is removed by the developing process locally, and an opening is formed penetrating the resist layer to reach the surface of the silicon substrate 300.

In a region 306 corresponding to mask cells each having the space width $D_1$ between the maximum space width $D_{max}$ and the minimum space width $D_{min}$, the residual ratio of the resist (after the exposure and development) takes an intermediate value between the region 308 where the mask cell has the maximum space width $D_{max}$ (280 nm) and the region 304 where the mask cell has the minimum space width $D_{min}$ (120 nm), and a resist layer 310 remains on the silicon substrate 300.

Next, a method for forming a dual damascene structure using the above described first photomask 100 will be described.

Figure 6A:
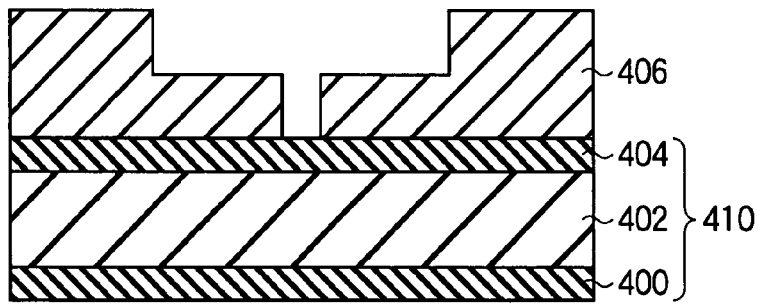
FIGS. 6A through 6E illustrate a process of forming a trench and a via-hole of a dual damascene structure using a first photomask, according to the second embodiment of the present invention.

FIG. 6A through 6E illustrate a process for forming a trench and a via-hole of the dual damascene structure using the resist pattern (formed using the first photomask 100). A to-be-etched substrate 410 is formed of a plurality of insulation films. To be more specific, the to-be-etched substrate 410 includes an SiN insulation film 400 as a lowermost layer, an SiOC layer 402 (composed of Low-k layer) as an intermediate layer, and an $SiO_2$ insulation film 404 as an uppermost layer. A resist layer is formed on the to-be-etched substrate 410, and is patterned using the first photomask 100 (as was described with reference to FIG. 5B) so that a resist pattern 406 is formed on the to-be-etched substrate 410 as shown in FIG. 6A.

Figure 6B:
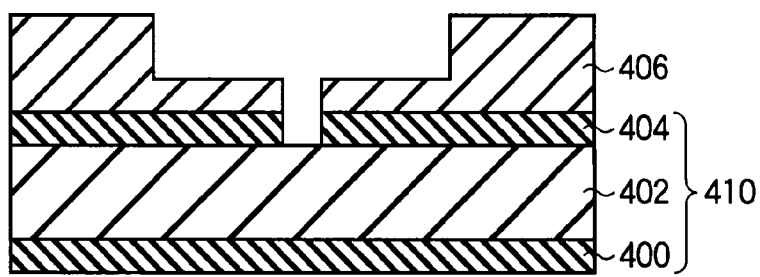

Then, the $SiO_2$ insulation film 404 as the uppermost layer is etched using the resist pattern 406 as a mask as shown in FIG. 6B. In this step, the entire surface of the resist pattern 406 is also etched.

Figure 6C:
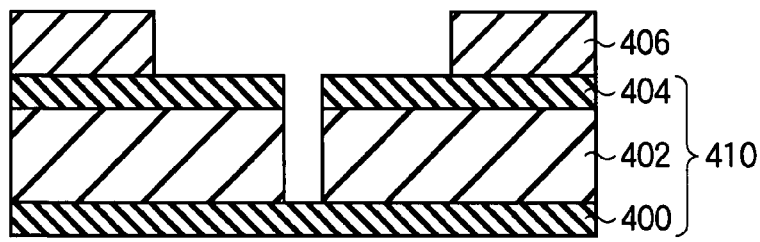

Next, the SiOC layer 402 (the low-k layer) as the intermediate layer is etched using the resist pattern 406 as a mask as shown in FIG. 6C.

Figure 6D:
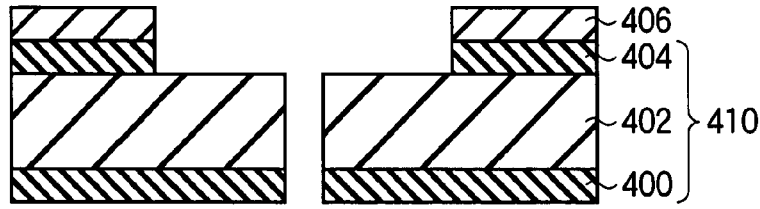

Then, the $SiO_2$ insulation film 404 as the uppermost layer and the SiN insulation film 400 as the lowermost layer are etched at the same time using the remaining resist pattern 406 as a mask as shown in FIG. 6D.

Figure 6E:
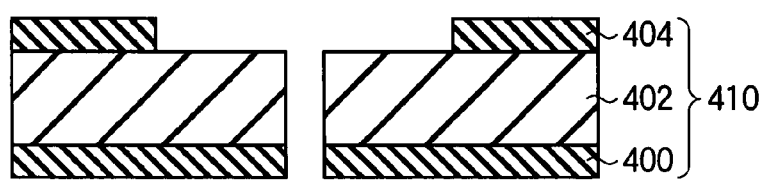

Finally, the resist pattern 406 is completely removed as shown in FIG. 6E.

With the above described process, the formation of the trench and the via-hole of the dual damascene structure is completed. By filling the trench and the via-hole with conductive metal such as copper or the like, the formation of the wiring pattern is completed.

In the above described process, the treatment process after the resist layer is coated on the to-be-etched substrate 410 before the etching is started is as follows. After the resist layer is coated on the to-be-etched substrate 410, a pre-baking treatment is performed at the atmospheric temperature of 90° C. for 60 seconds. Then, the exposure is performed using the i-ray stepper for 280 msec (milliseconds). Then, a post-exposure baking treatment is performed at the atmospheric temperature of 110° C. for 100 seconds. Next, the developing treatment is performed for 90 seconds using an alkali developing solution, for example, "NMD-3" (product name) manufactured by Tokyo Oka Kogyo Co., Ltd. Then, a post-developing baking treatment is performed at the atmospheric temperature of 120° C. for 100 seconds, with the result that the resist pattern 46 (FIG. 6A) is formed on the to-be-etched substrate 410.

Further, the above described etching is performed by an inductively coupled plasma-reactive ion etching (ICP-RIE) apparatus generally used in a manufacturing process of a micro machine.

Third Embodiment

Method for Forming Dual Damascene Structure Using Second Photomask

A method for forming a dual damascene structure using the above described second photomask 200 will be described.

First, a method for forming a resist pattern using the second photomask 200 on a substrate will be described. The description will be made to an example using a silicon substrate.

The silicon substrate has a diameter of 6 inches. A positive-type resist, for example, "IX-410" (product name) manufactured by JSR Corporation, is coated on the silicon substrate using a spin coater. The thickness of the resist coated on the silicon substrate is 3.5 μm. An i-ray (wavelength λ=365 nm) stepper, for example, "NSR-2205i11D" (product name) manufactured by Nikon Corporation, is used as an exposing device. The exposure conditions are as follows: the numerical aperture of projection lens NA=0.5, the coherence factor σ=0.5, and the magnification of a reduction projection is 5. Further, the length of each side of the mask cell 40 shown in FIG. 1B (i.e., a mask pitch P) is 400 nm.

A process for positioning the mask pattern of the second photomask 200 will be described with reference to FIG. 4. In order to determine the position of the mask pattern, it is necessary to identify the relationship between the space width of the mask cell and the thickness of the resist film that remains unremoved (hereinafter, referred to as a resist film thickness). FIG. 4 shows the relationship between the space width (see FIG. 1B) and the thickness of the resist film that remains unremoved after the exposure and development on condition that the exposure time is 280 msec. In FIG. 4, a horizontal axis indicates the space width (nm) of the mask cell, and a vertical axis indicates the resist film thickness (μm).

According to the characteristic curve shown in FIG. 4, the resist film thickness of 3.5 μm can be obtained when the space width is 120 nm (i.e., the minimum space width) on condition that the exposure time is 280 msec. Further, the resist film thickness of 0 μm can be obtained when the space width is 280 nm (i.e., the maximum space width) on the same exposure condition. Therefore, by controlling the space width, for example, by 5 nm, the target resist film thickness can be adjusted in 32 steps in the range from 0 to 3.5 μm.

In this case, the photomask is the same as the second photomask 200 having been described in the first embodiment. Further, the standardized light intensities of the first, second, third and fourth light intensities L1, L2, L3 and L4 satisfy:

0=L4<L3<L2<L1=1.

Figure 7A:
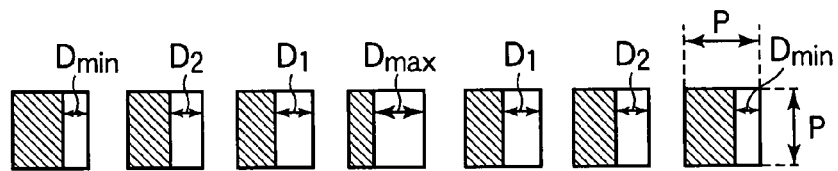
FIGS. 7A and 7B illustrate the relationship between configurations of the mask cells of the second photomask and shapes of the respective parts of the resist pattern according to the third embodiment of the present invention.
Figure 7B:
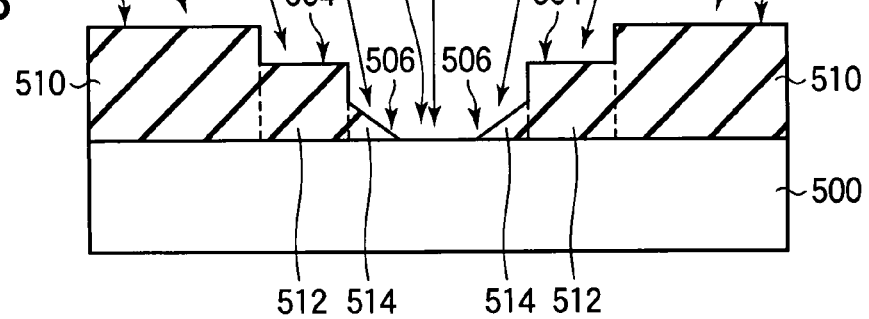

FIG. 7A illustrates configurations of the mask cells corresponding to shapes of respective parts of the resist pattern, and FIG. 7B illustrates the shape of the resist pattern after the exposure via the mask cells and development.

As shown in FIGS. 7A and 7B, in a region 502 corresponding to mask cells each having the minimum space width $D_{min}$ (i.e., 120 nm), the residual ratio of the resist (after the exposure and development) is 100%. In other words, the resist layer is not removed in the region 502, and forms a resist layer 510 completely remaining on the silicon substrate 500. The region 502 of the mask cells corresponds to a fourth region 240 (i.e., a light shielding region) of the second photomask 200.

In a region 508 corresponding to mask cells each having the maximum space width $D_{max}$ (i.e., 280 nm), the residual ratio of the resist (after the exposure and development) is 0%. In other words, the resist layer of the region 508 is removed by the developing process locally, and an opening is formed penetrating the resist layer to reach the surface of the silicon substrate 500.

In regions 506 and 504 corresponding to mask cells each having the space width $D_1$ or $D_2$ between the maximum space width $D_{max}$ and the minimum space width $D_{min}$, the residual ratios of the resist (after the exposure and development) take intermediate values between the region 508 where the mask cell has the maximum space width $D_{max}$ (280 nm) and the region 502 where the mask cell has the minimum space width $D_{min}$ (120 nm), and resist layers 514 and 512 remain on the silicon substrate 500.

In particular, a slope portion is formed in the region 506 corresponding to mask cells transmitting the lights of linearly changing light intensities. A vertical step portion is formed in the region 504 corresponding to mask cells transmitting the lights of a uniform light intensity.

Next, a method for forming a dual damascene structure using the above described resist pattern (formed using the second photomask) will be described.

Figure 8A:
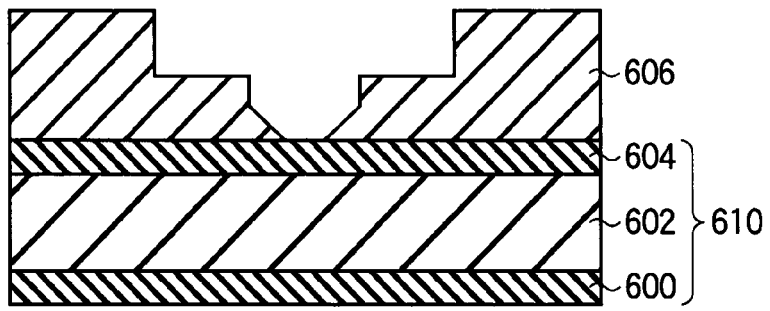
FIGS. 8A through 8E illustrate a process of forming a trench and a via-hole of a dual damascene structure using a second photomask, according to the third embodiment of the present invention.

FIG. 8A through 8E illustrate a process for forming a trench and a via-hole of the dual damascene structure using the resist pattern (formed using the second photomask). A to-be-etched substrate 610 is formed of a plurality of insulation films. To be more specific, the to-be-etched substrate 610 includes an SiN insulation film 600 as a lowermost layer, an SiOC layer 602 (composed of Low-k layer) as an intermediate layer, and an $SiO_2$ insulation film 604 as an uppermost layer. A resist layer is formed on the to-be-etched substrate 610, and patterned using the second photomask 200 (as was described with reference to FIG. 7B) so that a resist pattern 606 is formed on the to-be-etched substrate 610 as shown in FIG. 8A.

Figure 8B:
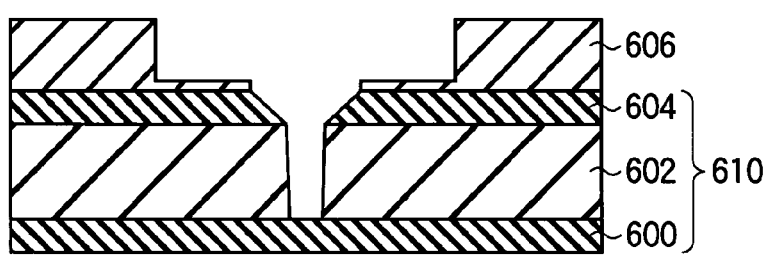

Then, the $SiO_2$ insulation film 604 (as the uppermost layer) and the SiOC layer 602 (as the intermediate layer) are etched using the resist pattern 606 as a mask as shown in FIG. 8B. In this step, the entire surface of the resist pattern 606 is also etched.

Figure 8C:
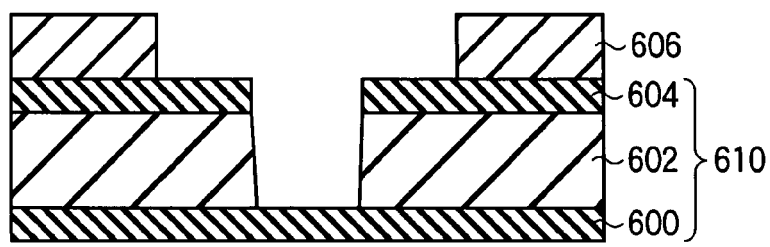

Next, the $SiO_2$ insulation film 602 and the SiOC layer 602 (the low-k layer) as the intermediate layer are further etched using the resist pattern 606 as a mask as shown in FIG. 8C.

Figure 8D:
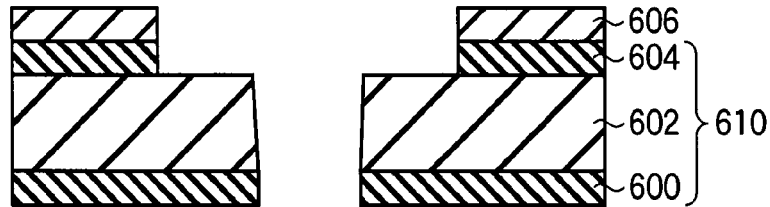

Then, the $SiO_2$ insulation film 604 as the uppermost layer and the SiN insulation film 600 as the lowermost layer are etched at the same using the remaining resist pattern 606 as a mask time as shown in FIG. 8D.

Figure 8E:
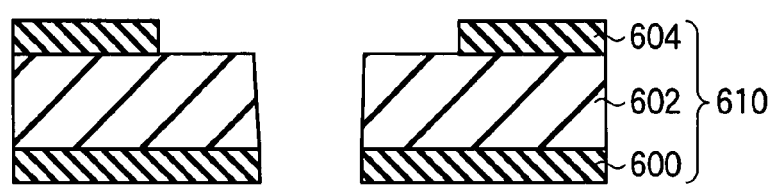

Finally, the resist pattern 606 is completely removed as shown in FIG. 8E.

With the above described process, the formation of the trench and the via-hole of the dual damascene structure is completed. By filling the trench and the via-hole with conductive metal such as copper or the like, the formation of the wiring pattern is completed.

In the above described process, the treatment process after the resist layer is coated on the to-be-etched substrate 610 before the etching is started is as follows. After the resist layer is coated on the to-be-etched substrate 610, a pre-baking treatment is performed at the atmospheric temperature of 90° C. for 60 seconds. Then, the exposure is performed using the i-ray stepper for 280 msec (milliseconds). Then, a post-exposure baking treatment is performed at the atmospheric temperature of 110° C. for 100 seconds. Next, the developing treatment is performed for 90 seconds using an alkali developing solution, for example, "NMD-3" (product name) manufactured by Tokyo Oka Kogyo Co., Ltd. Then, a post-developing baking treatment is performed at the atmospheric temperature of 120° C. for 100 seconds, with the result that the resist pattern 46 (FIG. 6A) is formed on the to-be-etched substrate 610.

Further, the above described etching is performed by an inductively coupled plasma-reactive ion etching (ICP-RIE) apparatus is generally used in a manufacturing process of a micro machine.

Advantages of the above described embodiments will be summarized as follows.

The first photomask 100 of the first embodiment includes the first region 110, the second region 120 surrounding the first region 110 and the third region 130 outside the second region 120 in the planar region of the mask substrate 102. The first region 110 includes the first group of mask cells transmitting the lights of the first light intensity L1 ($0<L1\leq 1$). The second region 120 includes the second group of mask cells transmitting the lights of the second light intensity L2 ($0<L2<L1\leq 1$). The third region 130 includes the third group of mask cells transmitting the lights of the third light intensity L3 ($0\leq L3<L2$). Therefore, it becomes possible to obtain a photomask for forming the resist pattern 406 (FIG. 6A) having the groove with a plurality of steps of different thicknesses in an arbitrary region.

The second photomask 200 of the first embodiment includes the first region 210, the second region 220 surrounding the first region 210, the third region 230 surrounding the second region 220 and the third region 130 outside the third region 230 in the planar region of the mask substrate 102. The first region 210 includes the first group of mask cells transmitting the lights of the first light intensity L1 ($0<L1\leq 1$). The second region 220 includes the second group of mask cells transmitting the lights of the first light intensity L1 at the boundary with the first region 210, transmitting the lights of the second light intensity L2 ($0<L2<L1\leq 1$) at the boundary with the third region 230, and transmitting the lights of the light intensities changing from the first light intensity L1 to the second light intensity L2 from the boundary with the first region 210 to the boundary with the third region 230. The third region 230 includes the third group of mask cells transmitting the lights of the third light intensity L3 ($0<L3<L2$). The fourth region 240 includes the fourth group of mask cells transmitting the lights of the fourth light intensity L4 ($0\leq L4<L3$). Therefore, it becomes possible to obtain a photomask for forming the resist pattern 606 (FIG. 8A) having the vertical step portion and the slope portion of different thicknesses in an arbitrary region.

Using the first photomask 100 to form the resist pattern, it becomes possible to form the resist pattern 406 (FIG. 6A) having the groove with a plurality of steps of different thicknesses by means of one photolithographic process and one etching process. The resist pattern can be used to form a practical dual damascene structure.

Using the second photomask 200 to form the resist pattern, it becomes possible to form the resist pattern 606 (FIG. 6A) having the vertical step portion and the slope portion of different thicknesses by means of one photolithographic process and one etching process. The resist pattern can be used to form a practical dual damascene structure.

The above described embodiments are merely examples, and the present invention is not limited to the above described embodiments.

For example, although the i-ray stepper is used as the exposing device in the respective embodiments, it is also possible to use a g-ray stepper (whose wavelength is 436 nm), KrF stepper (whose wavelength is 238 nm) or ArF stepper (whose wavelength is 193 nm).

Further, although the positive-type resist is used as the resist in the respective embodiments, it is also possible to use a negative-type resist. In this case, the resist film thickness increases as the irradiated light intensity increases.

While the preferred embodiments of the present invention have been illustrated in detail, it should be apparent that modifications and improvements may be made to the invention without departing from the spirit and scope of the invention as described in the following claims.

What is claimed is:

1. A photomask used for exposure to form a resist pattern having nonuniform thickness, said photomask comprising:
   a transparent mask having a planar region, said planar region including a first region, a second region surrounding said first region, and a third region outside said second region; and
   a plurality of square mask cells provided arranged in a first direction and in a second direction on said planar region, each of having a side shorter than a resolution limit of an optical system of an exposing device in which said photomask is used, and including at least one of a light transmitting region and a light shielding region formed of a light shielding film,
   wherein a light intensity of a transmitted light of said mask cell is a standardized light intensity, and is determined based on a ratio of an area of said light transmitting region to an area of said mask cell,
   wherein said mask cells comprise:
   a first group of mask cells provided in said first region and transmitting lights of a first light intensity greater than zero and less than or equal to 1;
   a second group of mask cells provided in said second region and transmitting lights of a second light intensity greater than zero and less than said first light intensity;
   a third group of mask cells provided in said third region and transmitting lights of a third light intensity greater than or equal to zero and less than said second light intensity, and
   wherein said light transmitting regions of at least said first and second groups of said mask cells arranged in said first direction form a continuous groove extending in said first direction, and said groove has a width in said second direction that varies along said first direction.

2. A photomask used for exposure to form a resist pattern having nonuniform thickness, said photomask comprising:
   a transparent mask substrate having a planar region, said planar region including a first region, a second region surrounding said first region, a third region surrounding said second region, and a fourth region outside said third region; and
   a plurality of square mask cells arranged in a first direction and in a second direction on said planar region, each having a side shorter than a resolution limit of an optical system of an exposing device in which said photomask is used, and including at least one of a light transmitting region and a light shielding region formed of a light shielding film;

wherein a light intensity of a transmitted light of said mask cell is a standardized light intensity, and is determined based on a ratio of an area of said light transmitting region to an area of said mask cell;

wherein said mask cells comprise:

a first group of mask cells provided in said first region and transmitting lights of a first light intensity greater than zero and less than or equal to 1;

a second group of mask cells provided in said second region and transmitting lights of said first light intensity at a boundary with said first region, transmitting lights of a second light intensity greater than zero and less than said first light intensity at a boundary with said third region, and transmitting lights of light intensities changing from said first light intensity to said second light intensity from said boundary with said first region to said boundary with said third region;

a third group of mask cells provided in said third region transmitting lights of a third light intensity greater than zero and less than said second light intensity;

a fourth group of mask cells provided in said fourth region and transmitting lights of a fourth light intensity greater than or equal to zero and less than said third light intensity, and wherein said light transmitting regions of at least said first, second and third groups of said mask cells arranged in said first direction form a continuous groove extending in said first direction, and said groove has a width in said second direction that varies along said first direction.

3. A method for forming a wiring pattern of a semiconductor element, said method comprising the steps of:

forming a resist pattern on a semiconductor substrate using said photomask according to claim 1 so that said resist pattern has a groove with a plurality of steps of different thicknesses, and etching said semiconductor substrate to obtain a shape corresponding to said resist pattern.

4. A method for forming a wiring pattern of a semiconductor, said method comprising the steps of:

forming a resist pattern on a semiconductor substrate using said photomask according to claim 2 so that said resist pattern has a vertical step portion and a slope portion of different thicknesses, and etching said semiconductor substrate to obtain a shape corresponding to said resist pattern.

5. The photomask according to claim 1, wherein the entire light shielding region of each of the square mask cells is disposed along an entire first side of the respective one of the square mask cells.

6. The photomask according to claim 1, wherein the entire light shielding region of each of the square mask cells is disposed along an entire first side of a respective one of the square mask cells and extends towards an opposite side thereof.

7. The photomask according to claim 1, wherein the light shielding regions of the square mask cells are disposed along a corresponding same side of the square mask cells.

8. The photomask according to claim 2, wherein the entire light shielding region of each of the square mask cells is disposed along an entire first side of the respective one of the square mask cells.

9. The photomask according to claim 2, wherein the entire light shielding region of each of the square mask cells is disposed along an entire first side of a respective one of the square mask cells and extends towards an opposite side thereof.

10. The photomask according to claim 2, wherein the light shielding regions of the square mask cells are disposed along a corresponding same side of the square mask cells.

* * * * *